:::: {.columns}
::: {.col}
(12) United States Patent
Hansen

(10) Patent No.: US 6,795,511 B1
(45) Date of Patent: Sep. 21, 2004

(54) METHOD FOR REDUCING THE SENSITIVITY OF A MAXIMUM LIKELIHOOD DETECTION TRELLIS TO CHANNEL VARIATIONS

(75) Inventor: Douglas Christian Hansen, Boulder, CO (US)

(73) Assignee: Storage Technology Corporation, Louisville, CO (US)

( * ) Notice: Subject to any disclaimer, the term of this patent is extended or adjusted under 35 U.S.C. 154(b) by 702 days.

(21) Appl. No.: 09/671,546

(22) Filed: Sep. 27, 2000

(51) Int. Cl.[7] .............................................. H04L 27/06
(52) U.S. Cl. ...................... 375/341; 375/265; 375/262
(58) Field of Search ................................ 375/265, 341, 375/345, 290, 261, 263, 254, 262; 371/45, 43; 714/788, 791, 792, 755; 341/100, 59; 360/46

(56) References Cited

U.S. PATENT DOCUMENTS

| | | | |
|---|---|---|---|
| 4,888,775 A | * 12/1989 | Karabed et al. | ............. 714/755 |
| 5,257,272 A | 10/1993 | Fredrickson | |
| 5,341,387 A | * 8/1994 | Nguyen | ....................... 714/788 |
| 5,974,091 A | * 10/1999 | Huff | ............................ 375/265 |

FOREIGN PATENT DOCUMENTS

| | | |
|---|---|---|
| EP | 0 801 503 | 10/1997 |
| EP | 0 913 950 | 5/1999 |
| GB | 2 302 486 | 1/1997 |

OTHER PUBLICATIONS

"Viterbi Detection of Class IV Partial Response on a Magnetic recording Channel", IEEE Trans. On Communications, vol. Com–34, No. 5, May 1986, pp. 434–461, authors Wood and Peterson.*

"Implementation of a multi–D trellis decoder for a 155 Mbit/s concatenated codec", Information Theory, 1994. Proceedings., 1994 IEEE International Symposium on , Jun. 27–Jul. 1, 1994, Nov.–Dec. 1994, Pietrobon, S.S.; Kasparian, J.J.; Gray, P.K.*

* cited by examiner

*Primary Examiner*—Stephen Chin
*Assistant Examiner*—Ted Wang
(74) *Attorney, Agent, or Firm*—Brooks Kushman P.C.

(57) ABSTRACT

An improved maximum likelihood detector with a trellis having three or more dimensions is disclosed. Trellis dimensions include a state dimension and a sample dimension found in a conventional Viterbi trellis. The additional dimensions are added to the trellis for adaptation to additional parameters that are responsive to channel variations such as pulse shape, amplitude, timing, media velocity and media tension. A set of rules govern most likely paths moving along the additional dimensions. In the preferred embodiment, a most likely path may transition up to a predetermined maximum number of unit lengths along each additional dimension per unit length movement in the sample dimension. Once a path has changed values in any given additional dimension then it must dwell at that value for a minimum number of samples.

16 Claims, 4 Drawing Sheets

METHOD FOR REDUCING THE SENSITIVITY OF A MAXIMUM LIKELIHOOD DETECTION TRELLIS TO CHANNEL VARIATIONS

TECHNICAL FIELD

The present invention is related to the field of partial response maximum likelihood detection trellis based channels.

BACKGROUND ART

Traditional peak detection channels in magnetic disk drives have been replaced by partial response maximum likelihood (PRML) read channels to allow for higher recording densities where individual symbols written within bit cells on the magnetic disk may overlap neighboring bit cells resulting in inter-symbol interference. PRML read channels make use of the read signal inside a desired bit cell and its neighboring bit cells to decide the desired bit cell's content. Information from the neighboring bit cells results in improved bit error rates over conventional peak detection channels in the presence of additive noise.

PRML read channels use a complicated set of equations to make an optimal bit decision based upon the read signal within several neighboring bit cells. PRML read channels became practical when Andrew J. Viterbi developed an algorithm that significantly reduced the number of computational steps required to make the optimal bit decision. Viterbi's algorithm is generally called a "trellis" and is represented by a two-dimensional graph of various allowable data patterns.

Trellis-based PRML read channels are not ideal in that they are more susceptible than peak detection channels to variations in the read signal's monopulse shape, amplitude, and timing. A PRML read channel will produce higher bit error rates than a peak detection read channel when the channel variations are significantly large. For this reason, PRML read channels were adopted in disk drives before tape drives. Tape drives have inherent channel variations that reduced the potential advantages of PRML read channels.

Attempts have been made to develop various adaptive algorithms that adjust PRML read channels in real time to account for read channel variations. However, these adaptive algorithms have only been able to adapt to slowly-varying parameters. The read channels parameters in tape drive applications can vary within a small number of bit cells. The time lag of the adaptive algorithms generally cause them to provide little benefit in tape applications. In some cases the adaptive algorithms cause increased bit error rates. What is desired is an approach that reduces the sensitivity of standard Viterbi trellis read channels to channel parameter variations.

DISCLOSURE OF INVENTION

The present invention is an improved maximum likelihood detector with a trellis having three or more dimensions. Trellis dimensions include a state dimension and a sample dimension found in a conventional Viterbi trellis. Additional dimensions are added to the trellis for adaptation to additional parameters that are responsive to channel variations. Consequently, the improved maximum likelihood detector provides lower error rates than conventional Viterbi trellis read channels in magnetic tape applications where channel variations can be significant.

Additional parameters include, but are not limited to, a pulse shape parameter, a pulse spacing parameter, a pulse amplitude parameter, a pulse time parameter, a media velocity parameter, and a media tension parameter. These parameters may vary in some magnetic tape applications at rates faster than some conventional adaptation algorithms can handle.

Rules are established to control movement along the additional dimensions. In the preferred embodiment, a path through the trellis can move up to a predetermined maximum number of unit lengths along any additional dimension for every one unit length movement along the sample dimension. Once a movement has been made along a respective additional dimension from a first value to a second value then the path must dwell at that second value for a minimum number of samples, preferably at least two samples.

Accordingly, it is an object of the present invention to provide an improved maximum likelihood detector having a three or more dimensional trellis, and rules for establishing paths through the trellis dimensions.

These and other objects, features and advantages will be readily apparent upon consideration of the following detailed description in conjunction with the accompanying drawings.

BEST MODE FOR CARRYING OUT THE INVENTION

Figure 1:
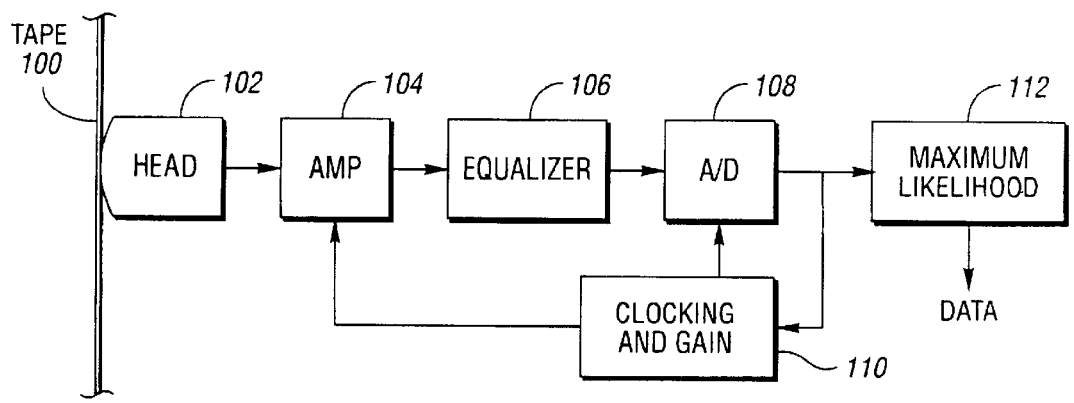
FIG. 1 is a block diagram of a typical patrial response maximum likelihood read channel.

FIG. 1 is a block diagram of a typical partial response maximum likelihood (PRML) read channel of a tape drive. Data stored in a magnetic tape 100 is converted into an analog signal by a magnetic head 102. Amplifier 104 and equalizer 106 amplify and shape the analog signal respectively so that an isolated magnetic flux transition in the magnetic tape 100 produces a monopulse 200 as shown in FIG. 2.

Figure 2:
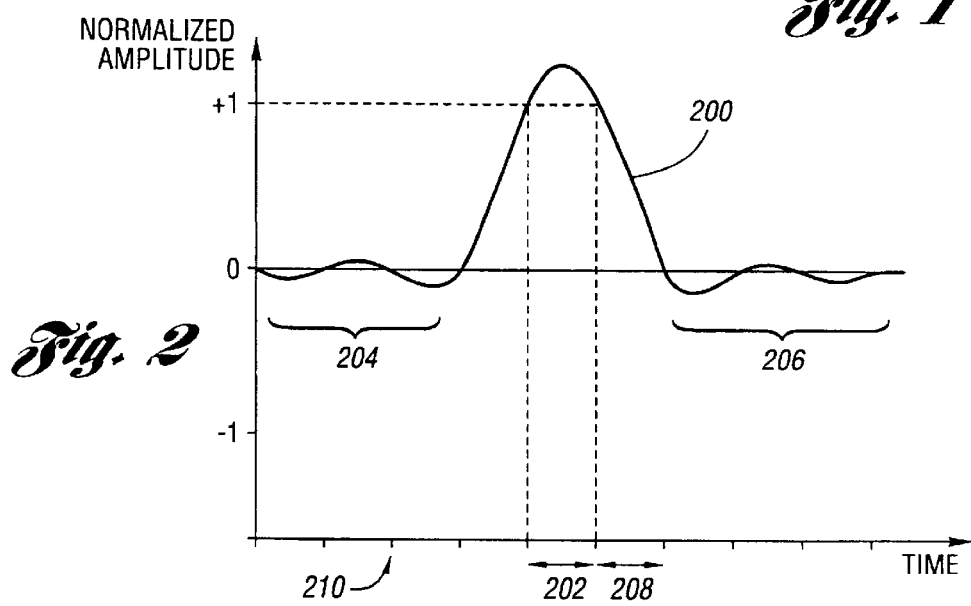
FIG. 2 is a graph of an ideal monopulse.

FIG. 2 is a graph of a normalized amplitude of an ideal monopulse 200 as a function of time in a class IV partial response (PR4). In particular, each unit of time shown along the time axis is one bit cell 202 long. The normalized amplitude means that the monopulse's amplitude is unity (+1 or −1) at the start and end of each bit cell 202. Tail sections 204 and 206 of monopulse 200 are relatively flat and cross zero amplitude at the start of each bit cell 202.

Returning to FIG. 1, the amplified and equalized analog signal is converted into the digital domain by an analog to digital converter 108. The digitized signal provides feedback to a clocking and gain controller 110. Clocking and gain controller 110 adjusts a gain of amplifier 104 to keep the analog signal normalized at the input to the analog to digital converter 108. Triggering of the analog to digital converter 108 is adjusted to sample the normalized and equalized analog signal at the proper times. Finally, the digitized signal is entered into a maximum likelihood detector 112 to determine the most likely data bit value in each bit cell 202. In an alternative embodiment, triggering of the analog to digital converter 108 may be performed asynchronously at a higher rate, and the sample provided to the maximum likelihood detector 112 is interpolated.

If the PRML read channel only had to deal with isolated monopulses 200, then the maximum likelihood detector 112 would only have to distinguish between bit cells 202 starting and ending with a unity (±1) amplitude and those that did not. Any bit cell 202 starting and ending with the unity amplitude represents a magnetic flux transition in the magnetic tape 100. All other bit cells 202 represent no flux change in the magnetic tape 100.

Figure 3:
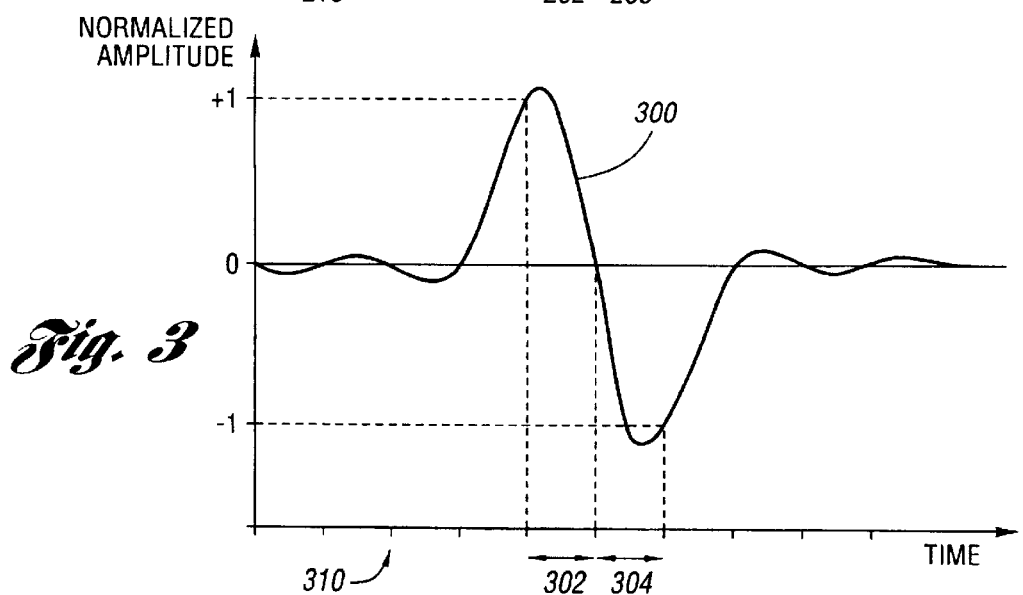
FIG. 3 is a graph of an ideal dipulse.

PR4 complicates the situation by allowing a magnetic flux transition in one bit cell 202 to be followed by an opposite magnetic flux transition in adjoining bit cells 202. As can be seen from FIG. 2, monopulse 200 extends beyond one bit cell 202 in time. FIG. 3 shows an example of an ideal dipulse signal 300 where a positive amplitude monopulse 200 in bit cell 302 is immediately followed by a negative amplitude monopulse 200 in adjoining bit cell 304. Here, the two monopulses 200 interfere in an effect referred to as intersymbol interference. Note that the normalized amplitude of the dipulse 300 is zero at the end of bit cell 302—start of bit cell 304. Likewise, a pattern of alternating amplitude monopulses 200 can be expanded to three or more adjoining bit cells.

Because of inter-symbol interference, the normalized amplitude of two consecutive samples from the analog to digital converter 108 can have different meanings depending upon earlier samples. For example, two consecutive samples of positive one and then zero normalized amplitude could mean that the bit cell contains the same magnetic flux orientation as the previous cell in the lagging tail 206 of a monopulse 200, see for example bit cell 208 in FIG. 2. Likewise, the same positive one and then zero normalized amplitude samples will result from bit cell 302 in FIG. 3 where the magnetic flux is of opposite orientation from the previous bit cell. The maximum likelihood detector 112 must be able to distinguish between these two different conditions.

Figure 4:
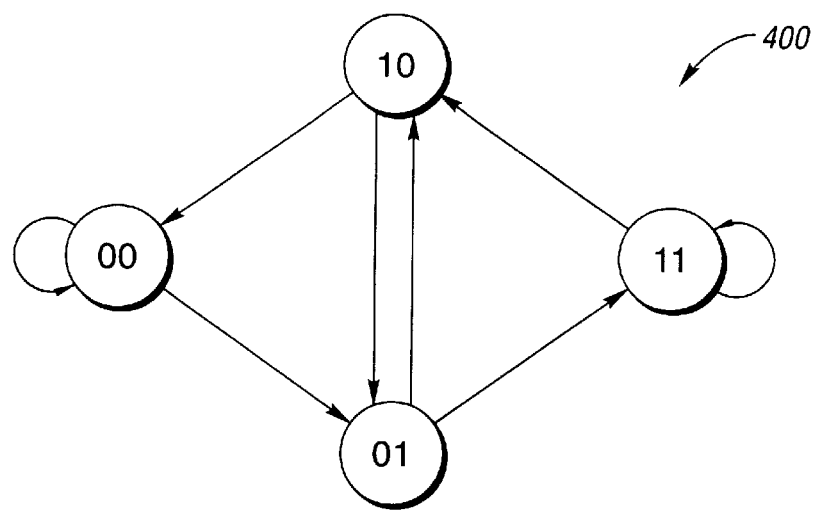
FIG. 4 is a state transition diagram of allowable state transitions.

The maximum likelihood detector 112 can be thought of as having a state machine having one state for every possible combination of two consecutive samples. In the case of a PR4 there are four possible states. These four state are caused by north-north (NN), north-south (NS), south-north (SN) and south-south (SS) magnetic flux orientations in consecutive bit cells. The "N" and "S" designations are often written as "0" and "1" giving the four states as 00, 01, 10 and 11. A PR4 state diagram 400 is shown in FIG. 4. Note that not all possible state-to-state transitions are available. For example, there is no direct transition between state 00 and state 11. In another example, state 10 may transition to state 00, but state 00 cannot transition back to state 10. Other classes of PR exist having higher orders of states for larger numbers of consecutive samples. For example, extended partial response 4 (EPR4) uses three consecutive samples to define eight states, and EEPR4 uses four consecutive samples to define sixteen states. The maximum likelihood detector 112 may also be used other applications such as cellular telephones, satellite communications, wired communications, fiber optics and the like.

Figure 5:
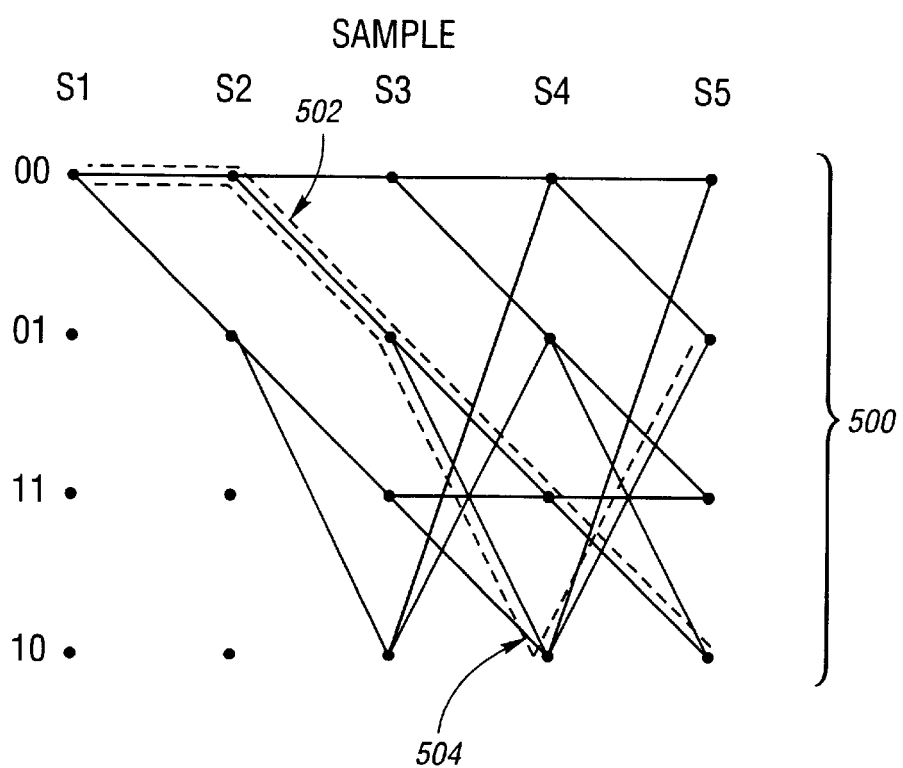
FIG. 5 is a partial trellis diagram of the state diagram of FIG. 4.

Plotting the state as a function of consecutive samples produces a trellis 500 as shown in FIG. 5. This trellis 500 only shows the allowable transitions assuming sample S1 starts in state 00. As each consecutive sample S2, S3, S4 and S5 are considered, trellis 500 branches out in accordance with the allowable state transitions shown in state diagram 400.

Working with several consecutive samples, the maximum likelihood detector 112 calculates the probability along each branch in trellis 500 searching for a most probable path. By this method, the trellis detector can distinguish a positive one and then zero normalized amplitude sequence caused by an isolated monopulse 200 from the same sequence caused by a dipulse 300. Assuming, for example, that sample S1 was taken at time 210 in FIG. 2, then the monopulse amplitude would follow a sequence of S1=0, S2=0, S3=1, S4=1, and S5=0. In terms of the trellis 500, this places the monopulse 200 in states S1=00, S2=00, S3=01, S4=11, and S5=10, as shown by path 502. In a dipulse 300 example, assume that S1 was taken at time 310 in FIG. 3. Here the sample sequence is S1=0, S2=0, S3=1, S4=0 and S5=−1. In terms of trellis 500, this places the dipulse 300 in states S1=00, S2=00, S3=01, S4=10, and S5=01, as shown by path 504.

When noise, distortion, timing errors and other forms of misequalization are introduced into the amplitude, shape and timing of the pulses then determining the most probable path through the trellis 500 becomes less reliable. Where the samples are at other amplitudes sufficiently removed from +1, 0 and −1, then the maximum likelihood detector 112 sometimes produces incorrect data. Other parameters from the read channel can also result in increased bit error rates from the trellis. They include, but are not limited to the velocity of the magnetic tape media 100 past the magnetic head 102 and the tension of the magnetic tape media 100.

These other parameters tend to be more significant in magnetic tape applications than in magnetic disk applications because they can vary faster in tape applications, because tape tension does not exist in a disk environment, and because disk velocity does not vary significantly.

Figure 6:
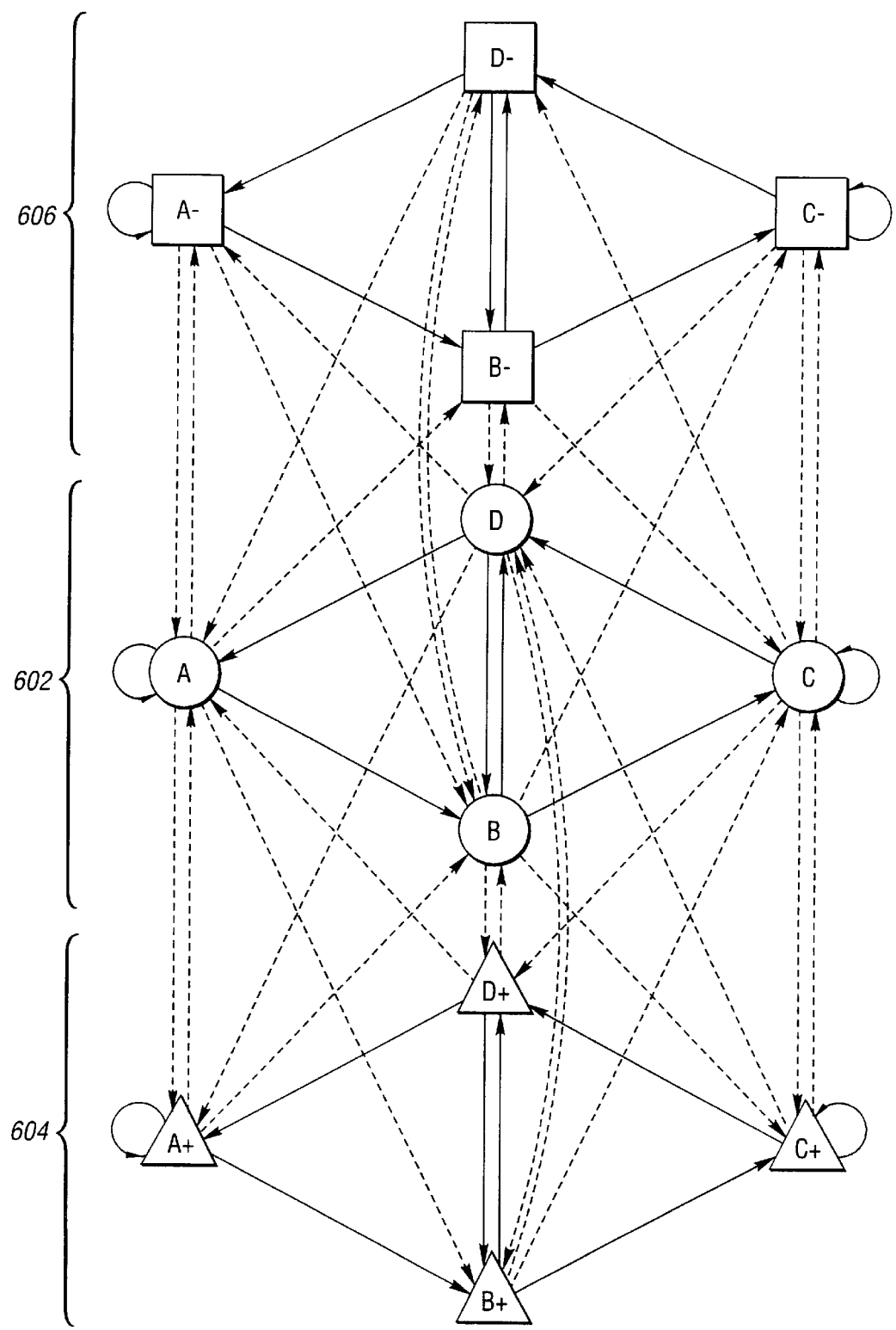
FIG. 6 is a three-level state diagram.

A common source of bit error in magnetic tape applications employing trellis read channels is the shape of the monopulse 200. In this situation, the present invention lowers the bit error rate by providing multiple trellises, with each trellis optimized for a different monopulse 200 shape parameter. In other words, each trellis is optimized for various amount of misequalization. An example of the approach is shown in FIG. 6. A standard PR4 state machine 602 is provided for a monopulse having an ideal pulse width. For simplicity, the individual states are designated with the letters A, B, C and D in place of 00, 01, 11 and 10 respectively. The solid lines between states A, B, C and D are intra-level transitions that are the same as the state transitions shown in FIG. 4.

The present invention adds two state machines 604 and 606 on different levels to the standard state machine 602. State machine 606 is optimized for a monopulse width at a 70% value of the ideal width. Individual states within state machine 606 are designated as A−, B−, C− and D−. Intra-level transitions are shown as solid lines. State machine 604 is optimized for a monopulse width at a 140% value of the ideal width. Individual states within trellis 604 are designated as A+, B+, C+ and D+. Here too, intra-level transitions are shown as solid lines.

Dashed lines in FIG. 6 represent inter-level transitions. Inter-level transitions parallel the intra-level transitions in terms of the beginning state and the ending state. For example, state A in state machine 602 may undergo an intra-level transition to state B, also within state machine 602. In the present invention, state A in state machine 602 may also undergo an inter-level transition to state B− within state machine 606, or an inter-level transition to state B+ within state machine 604. In this way the present invention provides fast adaptation to a rapidly changing pulse shape parameter.

Figure 7:
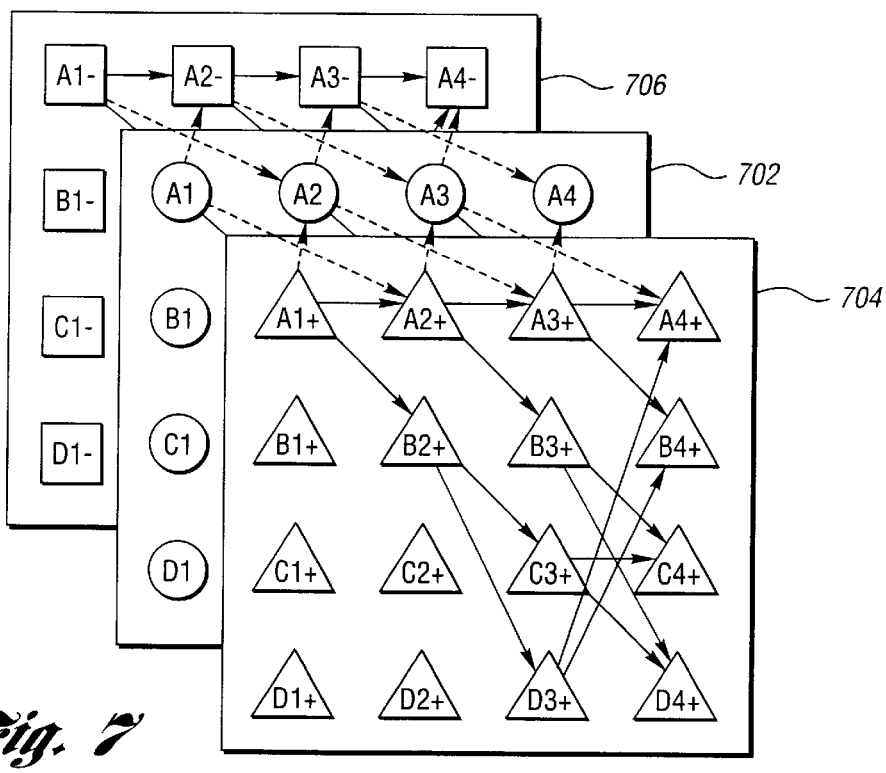
FIG. 7 is a partial three-dimensional trellis diagram showing intra-level branches.
Figure 8:
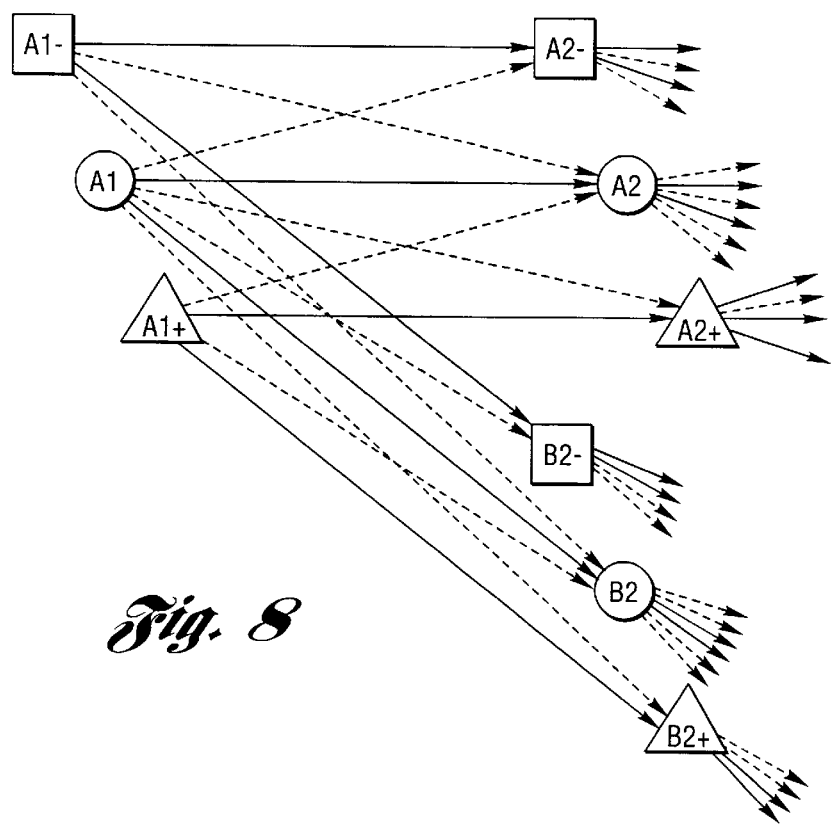
FIG. 8 is a partial three-dimensional trellis diagram showing inter-level branches.

FIG. 7 is a view of the state transition diagram of FIG. 6 in trellis form. State machines 602, 604 and 606 are depicted as trellises 702, 704 and 706 respectively. Individual state samples are designated as "snx", where s is the state A, B, C and D, n is the sample number 1, 2, 3, etc., and x is the level "−", "<blank>", or "+". Intra-level branches are shown as solid lines. Inter-level transitions are shown as dashed lines. FIG. 7 only shows a representative example of intra-branch and inter-branches possible. FIG. 8 is a partial expanded view of FIG. 7 showing the possible intra-level and inter-level branches from states A1−, A1, A1+ to states A2−, A2, A2+, B2−, B2 and B2+ in accordance with the state diagram of FIG. 6.

Rules are provided to govern a most likely path following an inter-level branch. The first rule in the preferred embodiment is that a most likely path can only branch up to a predetermined maximum number of levels (unit lengths) per sample. For example, the predetermined maximum number of levels may be only one level, as shown in FIG. 6. Note that there are no inter-level branches directly from trellis 604 to trellis 606. This rule is based upon an assumption that values of the other parameter resulting in an inter-level most likely path will vary slowly relative to the sample rate. It also helps simplify the number of possible most probable paths that the maximum likelihood detector 112 will have to examine. In alternative embodiments, multiple inter-level most likely paths may be allowed. A second rule in the preferred embodiment is that once a most likely path has followed an inter-level branch, then it must dwell on the new trellis (level) for a minimum number of transitions. This rule helps minimized oscillations between trellises (levels). In alternative embodiments, other minimum dwells may be allowed, including a minimum of one sample. Other rules not explicitly mentioned above may be applied to inter-level paths within the scope of the present invention.

Three levels are shown in the examples of FIGS. 6, 7 and 8. The present invention allows for two or more levels. For example, two additional levels could be added to FIG. 7 to bring the total number of levels to five. The two additional level could be optimized for other percentages of the ideal pulse width, for example 85% and 120%. In general, the number of levels can be thought of as a number of dimensions of the trellis beyond the standard one level having only a state dimension and a sample dimension. FIG. 7 is an example of a three-dimensional trellis. A trellis responsive to the pulse shape parameter and a pulse amplitude parameter would have four dimensions (stat, sample, shape and amplitude). The ability to expand the number of dimensions is limited in practical applications by the ability to compute the cumulative errors of each possible path in real time while determining the most likely path.

The present invention may be applied to classes of PRML read channels other than PR4. For example, extended partial response class IV (EPR4) and EEPR4 read channels may also embody three or more dimensional trellises. The present invention may also be applied where the data incorporates a run-length limited modulation code EPR4 is commonly used in existing magnetic tape applications. EPR4 involves the current sample and two most recent sample. This results in a state machine having eight individual states (not shown). Table 1 lists all of the states and the permissable state transitions for a three-level, three-dimensional EPR4 read channel implementing the present invention. Table 2 lists the non return to zero (NRZ) sample sequences associated with each state. Table 3 lists the normalized EPR4ML trellis voltages associated with state-to-state transitions. Other values may be used in alternative embodiments.

TABLE 1

| State | Level | may be preceded by: State | Level | Comments |
|---|---|---|---|---|
| 0 | 1 | 0 | 1 | |
|   |   | 4 | 1 | |
|   |   | 0 | 2 | b, c |
|   |   | 4 | 2 | b |
| 1 | 1 | 0 | 1 | |
|   |   | 4 | 1 | |
|   |   | 0 | 2 | b |
|   |   | 4 | 2 | b, c |
| 2 | 1 | 1 | 1 | a |
|   |   | 5 | 1 | a |
|   |   | 1 | 2 | a, b |
|   |   | 5 | 2 | a, b, c |
| 3 | 1 | 1 | 1 | |
|   |   | 5 | 1 | a |
|   |   | 1 | 2 | b |
|   |   | 5 | 2 | a, b |
| 4 | 1 | 2 | 1 | a |
|   |   | 6 | 1 | |
|   |   | 2 | 2 | a, b |
|   |   | 6 | 2 | b |
| 5 | 1 | 2 | 1 | a |
|   |   | 6 | 1 | a |
|   |   | 2 | 2 | a, b, c |
|   |   | 6 | 2 | a, b |
| 6 | 1 | 3 | 1 | |
|   |   | 7 | 1 | |
|   |   | 3 | 2 | b, c |
|   |   | 7 | 2 | b |
| 7 | 1 | 3 | 1 | |
|   |   | 7 | 1 | |
|   |   | 3 | 2 | b |
|   |   | 7 | 2 | b, c |
| 0 | 2 | 0 | 1 | b, c |
|   |   | 4 | 1 | b |
|   |   | 0 | 2 | |
|   |   | 4 | 2 | |
|   |   | 0 | 3 | b, c |
|   |   | 4 | 3 | b |
| 1 | 2 | 0 | 1 | b |
|   |   | 4 | 1 | b, c |
|   |   | 0 | 2 | |
|   |   | 4 | 2 | |
|   |   | 0 | 3 | b |
|   |   | 4 | 3 | b, c |
| 2 | 2 | 1 | 1 | a, b |
|   |   | 5 | 1 | a, b, c |
|   |   | 1 | 2 | a |
|   |   | 5 | 2 | a |
|   |   | 1 | 3 | a, b |
|   |   | 5 | 3 | a, b, c |
| 3 | 2 | 1 | 1 | b |
|   |   | 5 | 1 | a, b |
|   |   | 1 | 2 | |
|   |   | 5 | 2 | a |
|   |   | 1 | 3 | b |
|   |   | 5 | 3 | a, b |
| 4 | 2 | 2 | 1 | a, b |
|   |   | 6 | 1 | b |
|   |   | 2 | 2 | a |
|   |   | 6 | 2 | |
|   |   | 2 | 3 | a, b |
|   |   | 6 | 3 | b |
| 5 | 2 | 2 | 1 | a, b, c |
|   |   | 6 | 1 | a, b |
|   |   | 2 | 2 | a |

TABLE 1-continued

| State | Level | may be preceded by: State | Level | Comments |
|---|---|---|---|---|
|  |  | 6 | 2 | a |
|  |  | 2 | 3 | a, b, c |
|  |  | 6 | 3 | a, b |
| 6 | 2 | 3 | 1 | b, c |
|  |  | 7 | 1 | b |
|  |  | 3 | 2 |  |
|  |  | 7 | 2 |  |
|  |  | 3 | 3 | b, c |
|  |  | 7 | 3 | b |
| 7 | 2 | 3 | 1 | b |
|  |  | 7 | 1 | b, c |
|  |  | 3 | 2 |  |
|  |  | 7 | 2 |  |
|  |  | 3 | 3 | b |
|  |  | 7 | 3 | b, c |
| 0 | 3 | 0 | 2 | b, c |
|  |  | 4 | 2 | b |
|  |  | 0 | 3 |  |
|  |  | 4 | 3 |  |
| 1 | 3 | 0 | 2 | b |
|  |  | 4 | 2 | b, c |
|  |  | 0 | 3 |  |
|  |  | 4 | 3 |  |
| 2 | 3 | 1 | 2 | a, b |
|  |  | 5 | 2 | a, b, c |
|  |  | 1 | 3 | a |
|  |  | 5 | 3 | a |
| 3 | 3 | 1 | 2 | b |
|  |  | 5 | 2 | a, b |
|  |  | 1 | 3 |  |
|  |  | 5 | 3 | a |
| 4 | 3 | 2 | 2 | a, b |
|  |  | 6 | 2 | b |
|  |  | 2 | 3 | a |
|  |  | 6 | 3 |  |
| 5 | 3 | 2 | 2 | a, b, c |
|  |  | 6 | 2 | a, b |
|  |  | 2 | 3 | a |
|  |  | 6 | 3 | a |
| 6 | 3 | 3 | 2 | b, c |
|  |  | 7 | 2 | b |
|  |  | 3 | 3 |  |
|  |  | 7 | 3 |  |
| 7 | 3 | 3 | 2 | b |
|  |  | 7 | 2 | b, c |
|  |  | 3 | 3 |  |
|  |  | 7 | 3 |  |

Comments:

a: States 2 and 5 are eliminated when the trellis is designed for a run length limited code having a minimum of one code zero between adjacent code ones (d=1).

b: paths may follow these inter-level branches only after a minimum dwell c: these inter-level branches occur when the sample has a zero amplitude. It may be desirable to disallow these branch conditions in some applications to achieve a better the bit error rate because, when the signal amplitude is zero, there may not be sufficient information available to assume that the pulse shape has changed.

TABLE 2

| State | NRZ Sequence (earlier bit–later bit) |
|---|---|
| 0 | 000 |
| 1 | 001 |
| 2 | 010 |
| 3 | 011 |
| 4 | 100 |
| 5 | 101 |
| 6 | 110 |
| 7 | 111 |

TABLE 3

| First State | Second State | Sample Voltage |
|---|---|---|
| 0 | 0 | 0.0 |
| 0 | 1 | 0.5 |
| 1 | 2 | 0.5 |
| 1 | 3 | 1.0 |
| 2 | 4 | -0.5 |
| 2 | 5 | 0.0 |
| 3 | 6 | 0.0 |
| 3 | 7 | 0.5 |
| 4 | 0 | -0.5 |
| 4 | 1 | 0.0 |
| 5 | 2 | 0.0 |
| 5 | 3 | 0.5 |
| 6 | 4 | -1.0 |
| 6 | 5 | -0.5 |
| 7 | 6 | -0.5 |
| 7 | 7 | 0.0 |

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An improved maximum likelihood detector having a first trellis optimized for a first value of a parameter, the improvement comprising:

a second trellis optimized for a second value of the parameter that is different than the first value;

a plurality of branches extending between the first trellis and the second trellis; and wherein the parameter is selected from a group of parameters comprising a media velocity parameter, and a media tension parameter.

2. The maximum likelihood detector of claim 1 wherein the second value is up to a predetermined maximum number of unit lengths along the parameter from the first value.

3. The maximum likelihood detector of claim 1 wherein the maximum likelihood detector is operative to dwell a minimum number of samples after branching between the first trellis and the second trellis.

4. The maximum likelihood detector of claim 3 wherein the minimum number of samples is at least two samples.

5. The maximum likelihood detector of claim 1 wherein the parameter is selected from a group of parameters comprising a pulse shape parameter, a pulse spacing parameter, and a pulse amplitude parameter.

6. An improved maximum likelihood detector having a trellis, the trellis having a state dimension and a sample dimension, the improvement comprising at least one additional dimension of the trellis, the at least one additional dimension being associated with at least one parameter from a group of parameters comprising a media velocity parameter, and a media tension parameter.

7. The maximum likelihood detector of claim 6 wherein the maximum likelihood detector is operative to move up to a predetermined maximum number of unit lengths along each of the at least one additional dimensions in response to a unit length movement along the sample direction.

8. The maximum likelihood detector of claim 6 wherein the maximum likelihood detector is operative to dwell a minimum number of samples in the at least one additional dimension in response to a movement along the at least one additional dimension.

9. The maximum likelihood detector of claim 8 wherein the minimum number of samples is at least two samples.

10. The maximum likelihood detector of claim 6 wherein the at least one parameter is selected from a group of parameters comprising a pulse shape parameter, a pulse spacing parameter, a pulse amplitude parameter, and a pulse time parameter.

11. A method for establishing a path in a trellis having a state dimension, a sample dimension and a parameter dimension, the method comprising:

detecting a change in a value of the parameter dimension;

branching the path in the parameter dimension from a first value to a second value in response to detecting the change in the value; and dwelling the path at the second value in the parameter dimension a minimum number of samples in response to branching the path in the parameter dimension to minimize oscillations in the parameter dimension.

12. The method of claim 11 wherein the second value is up to a predetermined maximum number of unit lengths from the first value.

13. The method of claim 11 wherein the minimum number of samples is at least two samples.

14. The method of claim 11 further comprising selecting the parameter dimension from a group of parameter dimensions comprising a pulse shape dimension, a pulse spacing dimension, a pulse amplitude dimension, and a pulse time dimension.

15. A method for establishing a path in a trellis having a state dimension, a sample dimension and a parameter dimension, the method comprising:

detecting a change in a value of the parameter dimension;

branching the path in the parameter dimension from a first value to a second value in response to detecting the change in the value; and selecting the parameter dimension from a group of parameter dimensions comprising a media velocity dimension, and a media tension dimension.

16. An improved maximum likelihood detector having a first trellis optimized for a first value of a parameter, the improvement comprising:

a second trellis optimized for a second value of the parameter that is different than the first value;

a plurality of branches extending between the first trellis and the second trellis; and wherein the maximum likelihood detector is operative to dwell a minimum number of samples after branching between the first trellis and the second trellis.

\* \* \* \* \*